United States Patent
Richter et al.

(10) Patent No.: US 8,305,834 B2
(45) Date of Patent: Nov. 6, 2012

(54) SEMICONDUCTOR MEMORY WITH MEMORY CELL PORTIONS HAVING DIFFERENT ACCESS SPEEDS

(75) Inventors: Michael Richter, Ottobrunn (DE); Markus Balb, Unterhaching (DE); Christoph Bilger, München (DE); Martin Brox, Munich (DE); Peter Gregorius, Munich (DE); Thomas Hein, Munich (DE); Andreas Schneider, Gernlinden (DE)

(73) Assignee: Qimonda AG, Munich (DE)

( * ) Notice: Subject to any disclaimer, the term of this patent is extended or adjusted under 35 U.S.C. 154(b) by 167 days.

(21) Appl. No.: 12/710,800

(22) Filed: Feb. 23, 2010

(65) Prior Publication Data

US 2011/0205828 A1     Aug. 25, 2011

(51) Int. Cl.
*G11C 8/00* (2006.01)
(52) U.S. Cl. ................................. 365/230.03
(58) Field of Classification Search ............... 365/230.3
See application file for complete search history.

(56) References Cited

U.S. PATENT DOCUMENTS

| | | | |
|---|---|---|---|
| 5,517,626 A * | 5/1996 | Archer et al. ................ | 710/110 |
| 6,104,659 A * | 8/2000 | Yagishita et al. ............ | 365/226 |
| 6,310,815 B1 * | 10/2001 | Yamagata et al. ....... | 365/230.03 |
| 2004/0184302 A1 * | 9/2004 | Shirahama et al. ............ | 365/63 |
| 2006/0227609 A1 * | 10/2006 | Pascucci et al. ......... | 365/185.17 |
| 2008/0285370 A1 * | 11/2008 | Okuyama ..................... | 365/222 |
| 2010/0008129 A1 * | 1/2010 | Teramoto .................... | 365/149 |

* cited by examiner

*Primary Examiner* — Hoai V Ho
*Assistant Examiner* — Min Huang
(74) *Attorney, Agent, or Firm* — Dicke, Billig & Czaja, PLLC

(57) ABSTRACT

A semiconductor memory including a plurality of memory banks disposed on an integrated circuit, each memory bank including an array of memory cells, wherein a first portion of memory cells of the plurality of memory banks has a first access speed and a second portion of memory cells of the plurality of memory banks has a second access speed, wherein the first access speed is different from the second access speed.

14 Claims, 3 Drawing Sheets

SEMICONDUCTOR MEMORY WITH MEMORY CELL PORTIONS HAVING DIFFERENT ACCESS SPEEDS

BACKGROUND

Semiconductor memories, such as dynamic random access memories (DRAMs), are used in a wide variety of applications, such as personal computers, servers, graphic cards, digital televisions, and cell phones, for example. While DRAMs typically employ one of several standard architectures, the particular implementation of the architecture of a given DRAM is typically modified to meet the specific needs of the application in which the DRAM is being employed, such as to provide the highest performance (access speed) or to provide the lowest power consumption, for example.

The access speed of a DRAM is affected by parameters including block size, word line length, and bit line length, for example, with the access time of the entire DRAM being determined by the DRAM memory cell having the longest runtime or access time. As a result, for a given application, a DRAM meeting the requirements of the application data having the highest access speed requirement is selected, even though the majority of the overall application data has access speed requirements which could be met using a less costly DRAM having a slower access speed. As an alternative, a high speed cache memory device is often employed for data requiring high access speed, with a lower speed DRAM being employed for a remainder of the application data. However, employing separate memory devices is also costly.

SUMMARY

One embodiment provides semiconductor memory including a plurality of memory banks disposed on an integrated circuit, each memory bank including an array of memory cells, wherein a first portion of memory cells of the plurality of memory banks has a first access speed and a second portion of memory cells of the plurality of memory banks has a second access speed, wherein the first access speed is different from the second access speed.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

According to embodiments described herein, a semiconductor memory is provided, such as a DRAM memory chip, which includes a plurality of memory banks, wherein a portion of the memory cells of at least one of the memory banks has a first access speed and a portion of the memory cells of at least one of the memory banks has a second access speed.

Figure 1:
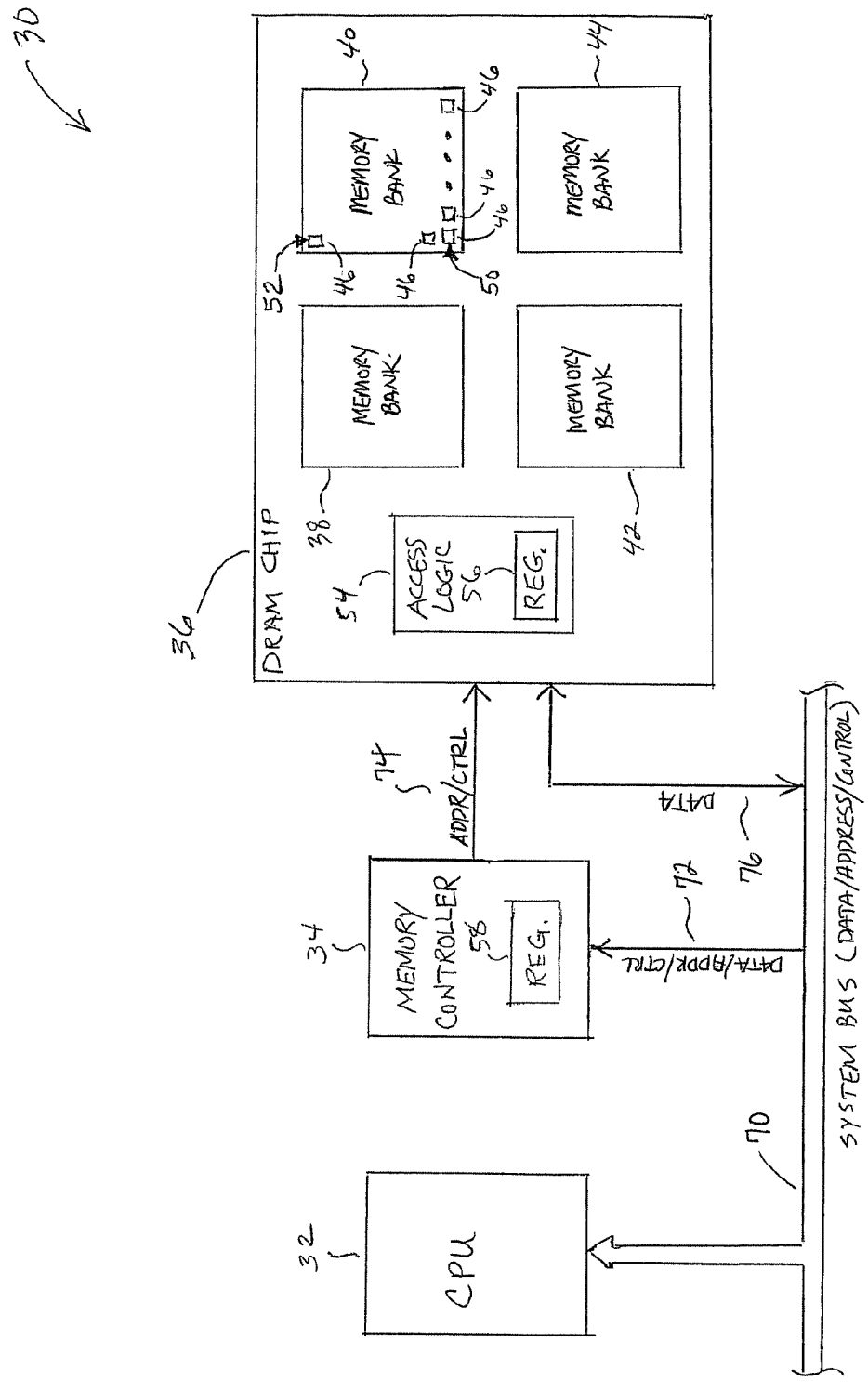
FIG. 1 is a block diagram generally illustrating a system including a memory according to one embodiment.

FIG. 1 is a block diagram generally illustrating an example of a computer system 30 including a central processing unit 32, a memory controller 34, and a semiconductor memory device, such as a DRAM chip 36, according to embodiments described herein. DRAM chip 36 includes a plurality of memory banks, indicated as memory banks 38, 40, 42, and 44, with each memory bank including an array of memory cells 46 arranged in a plurality of rows and columns, as indicated by row 48 and column 50, and with each memory bank including sense amplifier circuitry and row and column decoding circuitry (not shown in FIG. 1). DRAM memory chip 36 further includes access logic circuitry 54, which includes circuitry such as row and column address buffers, clock circuitry, and data-in and data-out buffers, for example. In one embodiment, access logic circuitry 54 and memory controller 34 respectively include mode or configuration registers 56 and 58.

CPU 32 communicates with other components of computer system 30, including memory controller 34 and DRAM chip 36' by transmitting data, address, and control signals over a system bus 70 (e.g. a high-speed bus) which typically includes a data bus, an address bus, and a control bus. Memory controller 34 receives data, address, and control signals via a bus 72, and provides address information (e.g. bank, row, and column addresses) and control signals, such as row address strobe (RAS), column address strobe (CAS), and write enable (WE), for example, to DRAM chip 36 via a bus 74. A data bus 76 is used to transmit data in a group having a desired number of bits which is typically equal to the data bus width of system bus 70.

In operation, memory controller 34 receives a control signal indicating that data is to be read from or written to DRAM chip 36 (i.e. an access operation). In response, memory controller 36 provides addresses (i.e. bank, row, and column addresses) and control signals to DRAM chip 36 via bus 74. During a read operation, data is read from memory cells 46 corresponding to the address signals and transmitted to system bus 70 via data bus 76. During a write operation, DRAM chip 36 receives data transmitted on system bus 70 via data bus 76 and stores the data at memory cells 46 corresponding to the appropriate address signals.

According to embodiments described in greater detail below, memory banks 38, 40, 42, and 44 are partitioned such that a portion of memory cells 46 of at least one of the memory banks 38, 40, 42, and 44 has a first latency or access speed and that a portion of the memory cells 46 of at least one of the memory banks 38, 40, 42, and 44 has a second latency or access speed. In one embodiment, the first and second latencies associated with the different portions of memory cells 46 of memory banks 38, 40, 42, and 44 are provided in configuration registers 56 and 58 to enable proper access to these different memory regions.

In one embodiment, the first access speed is faster than the second access speed, such that the portion of memory cells 46 of the at least one of the memory banks 38, 40, 42, and 44 is employed as a cache-type memory, thereby eliminating the need for computer system 30 to utilize a cache memory chip (e.g. a Level 2 cache) separate from DRAM chip 36.

Figure 2:
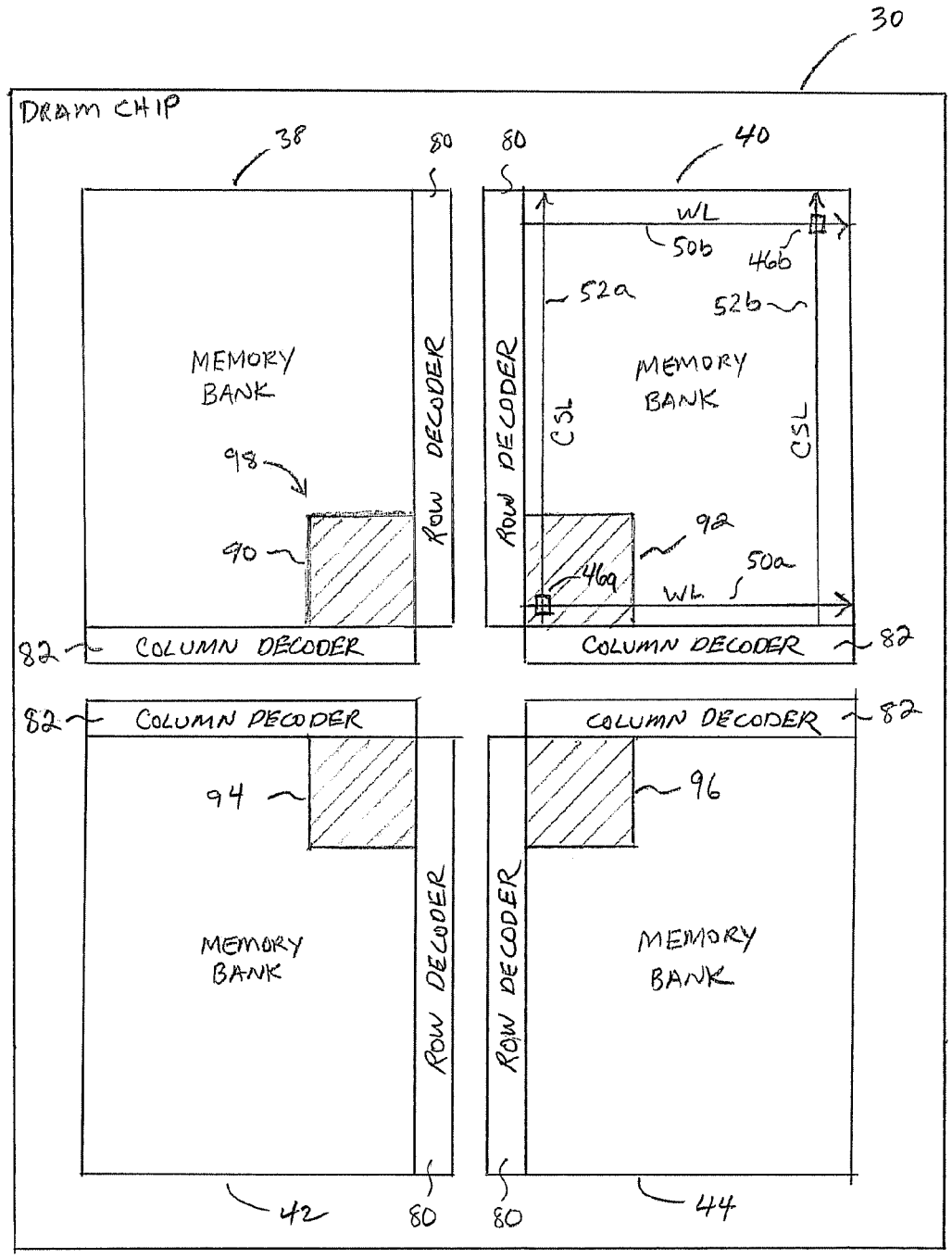
FIG. 2 is a block diagram generally illustrating portions of a DRAM according to one embodiment.

FIG. 2 is a block diagram generally illustrating one embodiment of DRAM chip 36. As illustrated, DRAM chip 36 includes memory banks 38, 40, 42, and 44, with each memory bank including a row decoder 80 and a column decoder 82. In one embodiment, memory banks 38, 40, 42, and 44 are arranged so that row decoders 80 of memory banks 38 and 40 are disposed along adjacent edges and row decoders 80 of memory banks 42 and 44 are disposed along adjacent edges. Additionally, column decoders 82 are disposed along adjacent edges of memory banks 38 and 42, and column decoders 80 are disposed along adjacent edges of memory banks 40 and 44.

In general, data path lengths in a memory core (e.g. memory banks 38, 40, 42, and 44 and associated row and column decoders 80 and 82) impact signal runtimes, and directly affect the access time or latency of the memory. For example, a data path length for memory cell 46a, which corresponds to row and column 50a and 52a having lower-order row and column addresses, is shorter than a data path length for memory cell 46b. As such, memory cell 46a has a shorter latency than memory cell 46b. However, as described earlier, in conventional DRAMs, the access speed is based only on the latency of the memory cell having the worst or longest signal runtime.

According to one embodiment, as illustrated by FIG. 2, memory cells 46 of regions or portions 90, 92, 94, and 96 (indicated by the "hatched" regions) of memory banks 38, 40, 42, and 44, respectively, corresponding to a selected range of low-order row and column addresses are accessed by memory controller 34 using a first latency or access speed and a remaining portion of memory cells 46 of each of the memory banks 38, 40, 42, and 44 are access using a second latency, with the first latency being shorter than the second latency.

In one embodiment, portions 90, 92, 94, and 96 of memory banks 38, 40, 42, and 44 together form a logical memory bank 98 which has a first access speed, with a remaining portion of the memory cells 46 of each of the memory banks 38, 40, 42, and 44 having a second access speed. In one embodiment, logical memory bank 98 operates as a cache-type memory, such as for CPU 32, for example. According to one embodiment, while logical memory bank 98 is operating in a cache mode, DRAM chip 36 is configured to operate the remaining slower regions of memory banks 38, 40, 42, and 44 in a self-refresh mode, which reduces the power consumption of DRAM chip 36.

In one embodiment, the selected range of low-order row and column addresses is the same for each of the portions 90, 92, 94, and 96 of memory banks 38, 40, 42, and 44. In one embodiment, the range of low-order row and column addresses is selectable, such as by memory controller 34, with a larger range resulting in an increased memory capacity or density of logical memory bank 98, but a longer latency, and a shorter range resulting in a decreased memory capacity, but a shorter latency. In one embodiment, the selected range can be selected from a plurality of predetermined ranges row and column address ranges. As mentioned above, the latency settings and row/column address ranges associated with the fast and slow memory regions are stored in configuration registers 56 and 58 of DRAM memory 36 and memory controller 34.

Figure 3:
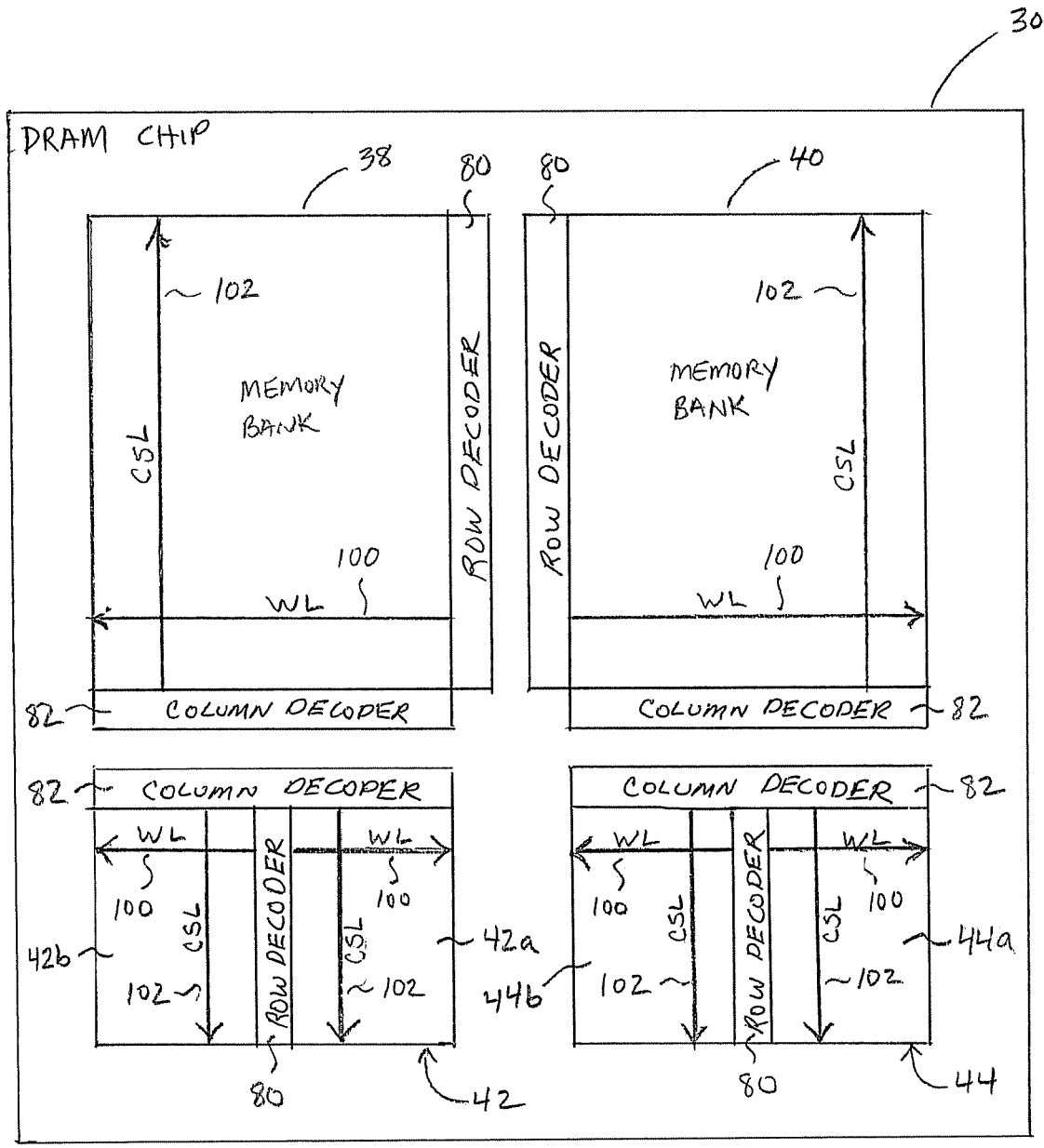
FIG. 3 is a block diagram generally illustrating portions of a DRAM according to one embodiment.

FIG. 3 is a block diagram generally illustrating one embodiment of DRAM memory chip 36. DRAM chip 36 includes memory banks 38, 40, 42, and 44, with each memory bank including a row decoder 80 and a column decoder 82 and corresponding row or word lines (WL) and bit or column select lines (CSL), as respectively indicated at 100 and 102.

In general, slow access speed memory banks have a higher density or memory capacity and employ longer bit and word lines than fast access speed memory banks. Additionally, column and row decoders for memory banks having slower access speeds are often positioned along an edge of the array of memory cells, while column and row decoders for memory banks having fast access speeds may be positioned at a center of the array of memory cells so that the column and word lines have the length and load.

In the embodiment of FIG. 3, memory banks 38 and 40 are configured as slow speed memory banks, while memory banks 42 and 44 are configured as high speed memory banks (i.e. memory banks 42 and 44 have a shorter latency than memory banks 38 and 40). In one embodiment, low-speed memory banks 38 and 40 have a same memory density or capacity which is greater than a memory density or capacity of high speed memory banks 42 and 44.

Row decoders 80 and column decoders 82 are positioned along the edges of the memory cell arrays of memory banks 38 and 40, with row decoder 80 of memory bank 38 being positioned along an edge adjacent to row decoder 80 of memory bank 40. Column decoders 82 are positioned along the edges of the array of memory cells of memory banks 42, with column decoders 82 of memory banks 38 and 42 being positioned along adjacent edges and column decoders 82 of memory banks 40 and 44 being positioned along adjacent edges. Row decoders 80 are positioned in the center of the arrays of memory cells of memory banks 42 and 44, thereby partitioning memory banks 42 and 44 into sub-arrays or sub-banks 42a, 42b and 44a, 44b.

Memory controller 34 may logically configure memory blocks 38, 40, 42, and 44 so that a logical memory block may comprise a single memory block, either a fast access memory block (e.g. memory block 42) or a slow access block (e.g. memory block 38). In other embodiment, a logical block may be configured as a combination of multiple array blocks. For example, in one embodiment, a logical block consists of slow speed memory banks 38 and 40. In one embodiment, a logical block may consist of a combination of fast and slow speed memory blocks, such as memory blocks 40 and 44, for example, with the lower order row addresses corresponding to fast speed memory block 44 and the higher order row addresses corresponding to slower speed memory block 42. The assignment of memory blocks to logical banks may be fixed or may be programmable, such as by memory controller 34.

In one embodiment, either or both fast speed memory blocks 42 and 44 can be configured to operate in either a single cell or twin cell mode of operation. In a twin cell mode of operation, a data bit is stored differentially in adjacent bit lines that are connected to a same sense amplifier, with the twin cell mode of operation being accomplished by modifying the operation of the row decoder 80 (e.g. 1 or 2 word lines being activated), column decoder 82 and associated sense amplifier control.

In a fashion similar to that described above with respect to FIG. 2, the latency settings and row/column address ranges associated with the fast and slow memory regions are stored in configuration registers 56 and 58 of DRAM memory 36 and memory controller 34. Additionally, programmable features, including row/column address ranges and the desired configuration of memory banks (e.g. single cell or twin cell operation), are written to a configuration registers 56 and 58.

Furthermore, although described herein primarily with respect to a DRAM employing four memory banks, the teachings herein can be applied to DRAMs employing other numbers of memory banks (e.g. 8 memory banks). Additionally, the teachings herein can be applied to other memory types, including SRAM, SDRAM, and DDR-SDRAM, for example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor memory comprising:
   a plurality of memory banks disposed on an integrated circuit, each memory bank including an array of memory cells, wherein a first portion of memory cells of the plurality of memory banks has a first access speed and a second portion of memory cells of the plurality of memory banks has a second access speed, wherein the first access speed is different from the second access speed,
   wherein each memory bank has a same memory size and the array of memory cells is arranged in a plurality of rows and columns, and wherein the first portion of memory cells comprises memory cells of the array of memory cells of each memory bank corresponding to a first range of row and column addresses, and the second portion of memory cells comprises memory cells of the array of memory cells of each memory bank corresponding to a second range of row and column addresses, wherein the semiconductor memory comprises a dynamic random access memory.

2. The semiconductor memory of claim 1, wherein the first range comprises a range of low-order row and column addresses of the array of memory cells of each memory bank, beginning with a first row and a first column, and the second range comprises remaining higher order row and column addresses of the array of memory cells of each memory bank such that the first access speed is faster than the second access speed.

3. The semiconductor memory of claim 1, wherein the plurality of memory banks comprises:
   at least one memory bank having a first size, wherein the first portion comprises all memory cells of the array of memory cells of the memory bank having the first size; and
   at least one memory bank having a second size, wherein the second portion comprises all memory cells of the array of memory cells of the memory bank having the second size.

4. The semiconductor memory of claim 3, wherein the second size is greater than the first size, and wherein the first access speed is faster than the second access speed.

5. A method of configuring the semiconductor memory of claim 1 comprising:
   disposing a plurality of memory banks on a single integrated circuit chip, each memory bank including an array of Dynamic Random Access Memory (DRAM) memory cells;
   accessing a first portion of memory cells of the plurality of memory banks using a first access speed; and
   accessing a second portion of memory cells of the plurality of memory banks at a second access speed, wherein the first access speed is faster than the second access speed.

6. The method of claim 5, wherein disposing the plurality of memory banks includes:
   configuring the memory banks so that each memory bank has a same memory size and the array of memory cells is arranged in a plurality of rows and columns, and wherein the first portion of memory cells comprises memory cells of the array of memory cells of each memory bank corresponding to a first range of row and column addresses, and the second portion of memory cells comprises memory cells of the array of memory cells of each memory bank corresponding to a second range of row and column addresses.

7. The method of claim 5, wherein disposing the plurality of memory banks includes:
   configuring the memory banks so that at least one memory bank has a first size, wherein the first portion comprises all memory cells of the array of memory cells of the memory bank having the first size; and
   configuring the memory banks so that at least one memory bank has a second size, wherein the second portion comprises all memory cells of the array of memory cells of the memory bank having the second size, wherein the second size is greater than the first size.

8. A semiconductor memory configuration comprising:
   at least one set of four memory banks disposed in a two-by-two grid on an integrated circuit, each memory bank of the set being of a same memory size and including an array of memory cells arranged in a plurality of rows and columns and having a row decoder and a column decoder configured to access memory cells based on row and column addresses received via address lines, wherein a first portion of memory cells of each memory bank corresponding to a range of row and column addresses is accessed at a first access speed, and a second portion of memory cells of each memory bank corresponding to remaining row and column addresses is accessed at a second access speed, the first access speed being faster than the second access speed, wherein the semiconductor memory comprises a dynamic random access memory.

9. The semiconductor memory configuration of claim 8, wherein the range of row and column addresses is selectable.

10. The semiconductor memory configuration of claim 9, where the range is selected from a predetermined plurality of ranges, each range having a corresponding access latency.

11. The semiconductor memory configuration of claim 8, wherein the range and a corresponding access latency to be employed when accessing the first portion of memory cells is stored in a register.

12. The semiconductor memory configuration of claim 8, wherein the second portion of memory cells is configured to operate in a refresh mode while the first portion of memory cells is being accessed.

13. The semiconductor memory configuration of claim 8, wherein the memory banks comprise dynamic random access memory banks.

14. The semiconductor memory configuration of claim 8, wherein the row decoder and column decoder of a memory bank are disposed along edges of the memory bank and orthogonal to one another, wherein the four memory banks are arranged such that a row decoder of a first memory bank is adjacent to a row decoder of a second memory bank, a row decoder of a third memory bank is adjacent to a row decoder of a fourth memory bank, a column decoder of the first memory bank is adjacent to a column decoder of the third memory bank, and a column decoder of the second memory bank is adjacent to a column decoder of the fourth memory bank.

* * * * *